United States Patent [19]

Takagi et al.

[11] Patent Number: 5,216,677
[45] Date of Patent: Jun. 1, 1993

[54] DATA REPRODUCING APPARATUS

[75] Inventors: Yuji Takagi, Kadoma; Isao Satoh, Neyagawa; Yoshihisa Fukushima, Osaka; Katsumi Murai, Moriguchi, all of Japan

[73] Assignee: Matsushita Electric Industrial Co., Ltd., Osaka, Japan

[21] Appl. No.: 585,409

[22] Filed: Sep. 20, 1990

[30] Foreign Application Priority Data

Sep. 20, 1989 [JP] Japan .................. 1-243783

[51] Int. Cl.⁵ .......................... G06F 11/00
[52] U.S. Cl. .................. 371/40.3; 371/40.1; 371/65
[58] Field of Search ........ 371/40.3, 65, 40.1; 341/59; 370/112

[56] References Cited

U.S. PATENT DOCUMENTS

| | | | |
|---|---|---|---|
| 4,146,099 | 3/1979 | Matsushima et al. | 371/65 |
| 4,299,154 | 11/1981 | Dietrich et al. | 84/635 |
| 4,300,232 | 11/1981 | Kato | 370/112 |
| 4,421,001 | 12/1983 | Wilcox | 84/617 |
| 4,684,921 | 8/1987 | Fok et al. | 341/59 |
| 4,759,018 | 7/1988 | Buchner | 370/112 |
| 4,760,378 | 7/1988 | Iketani et al. | 341/59 |
| 4,855,999 | 8/1989 | Chao | 370/112 |
| 5,051,998 | 9/1991 | Murai et al. | 371/65 |

OTHER PUBLICATIONS

Error-Correcting Codes publication of 1972, Peterson et al.

Primary Examiner—Robert W. Beausoliel, Jr.
Assistant Examiner—Allen M. Lo
Attorney, Agent, or Firm—Price, Gess & Ubell

[57] ABSTRACT

A data reproducing system is provided wherein data stored in an optical disk can be read and, in accordance with a coded error detection and correction code, can have an error pointer defined in synchronization with a modulated data of one symbol. This information can be transmitted, through a time division multiplexing circuit, at a faster clock speed than a demodulating clock with which the timing of a data demodulating will be controlled.

7 Claims, 5 Drawing Sheets

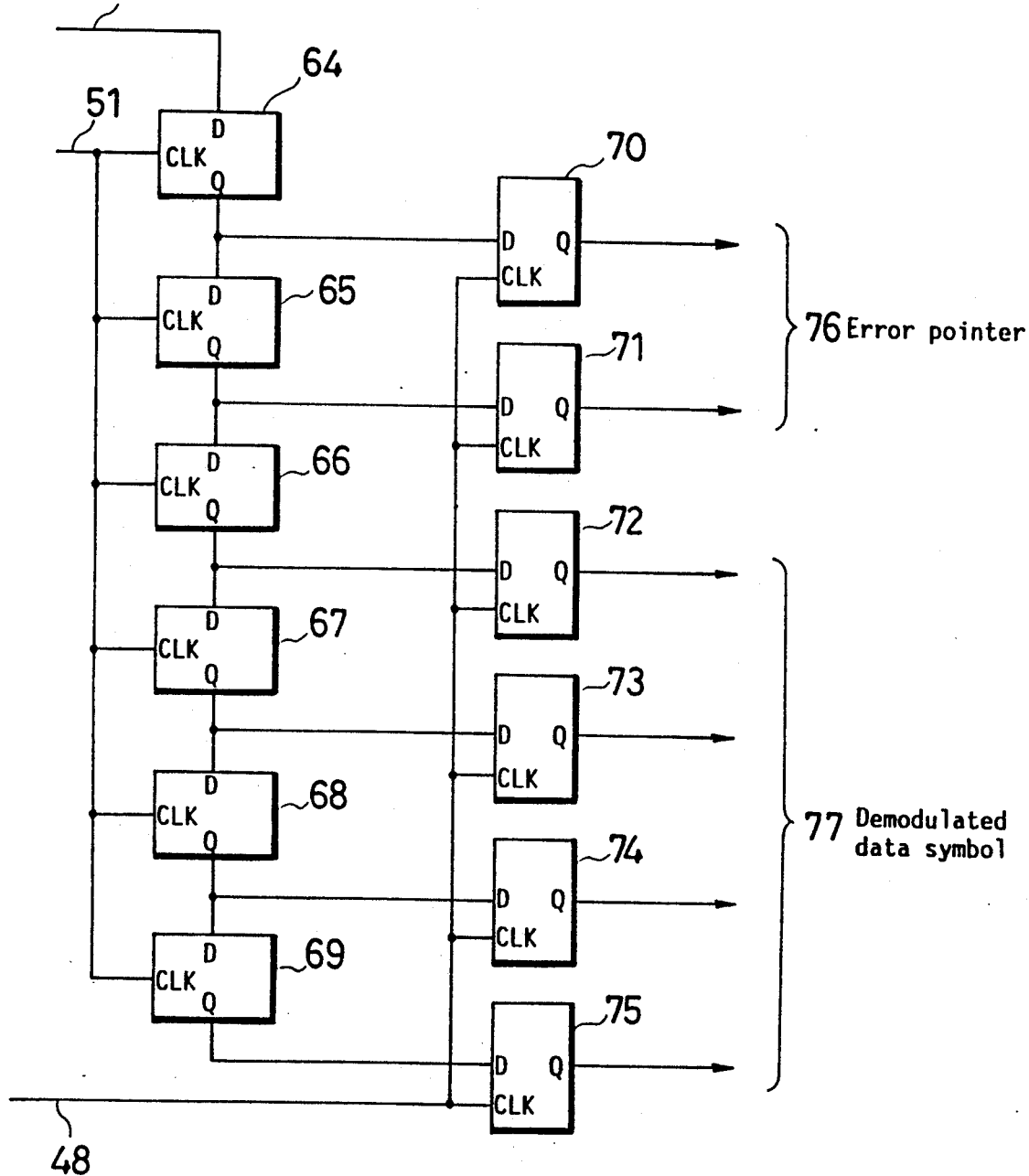

DATA REPRODUCING APPARATUS

BACKGROUND OF THE INVENTION (1) Field of the Invention

This invention relates to an external storage device of a computer such as an optical disk data reproducing apparatus, especially to a data reproducing apparatus which reproduces data by conducting erasure correction by use of an error pointer.

(2) Description of the Prior Art

It is absolutely necessary that external storage devices of computers such as a magnetic disk apparatus and an optical disk apparatus have an ability of reproducing recorded data. Namely, extremely high reliability in data reproduction is required for these apparatuses. Generally, therefore, these apparatuses employ a construction in which the recorded data is encoded with an error detection and correction code such as a Reed-Solomon code and then decoded for reproduction, thus protecting the data from various errors caused by defective recording mediums or the like.

If erasure correction is conducted by appointing an error position as an error pointer while the error detection and correction code is decoded, the error correcting capability can be improved. This is described in "Error-Correcting Codes: Second Edition" (pp. 305-307, THE MIT PRES 1972) written by W. Wesley Peterson and E. J. Weldon. The error pointer can be generated, for instance, based on error information obtained while data demodulation and the like.

FIG. 1 is a block diagram of a conventional data reproducing apparatus which conducts erasure correction using an error pointer.

1 refers to an optical disk comprising sectors, each of which stores a data therein, 2 to an optical head formed of a semiconductor laser or the like, 3 to a preamplifier for amplifying a signal read out from the optical disk (will be referred to as a read-out signal, hereinafter), 4 to an equalizer for equalizing a waveform, 5 to a comparator for converting the read-out signal into a binary read-out data 21 in accordance with a reference value, 6 to an address detector for detecting an address recorded in a head of each sector, and 7 to a CPU for totally controlling the apparatus. 8 refers to an envelope detector for detecting that an envelope of the amplified read-out signal is below a specified level and then generating an error pointer 9 refers to an RS detector for detecting resynchronization signals which are recorded in the optical disk 1 at a certain pitch, the resynchronization signals being for compensating for bit slips, 10 to a DM detector for detecting a synchronization signal indicating a leading edge of the data, and 11 to a PLL circuit for reading out a clock from the read-out data 21, the clock being used for demodulation of the read-out data 21. 12 refers to a demodulator for demodulating the read-out data 21 into a demodulated data 22, 13 to a timing gate generator for controlling demodulating timing, and 14 to an error detecting and correcting circuit for decoding an error detection and correction code. 15 is a RAM used to operate the error detecting and correcting circuit 14 and also used as a data buffer. 16 refers to a modulation rule violation detector for detecting a modulation rule violation and then generating an error pointer. A block defined by a dashed line is usually realized as a single circuit block referred to as a demodulating block 18, the block 18 comprising, for example, a one-chip LSI.

The apparatus having the above construction is operated in the following way.

From a signal read out from the optical disk 1, addresses are detected by the address detector 6. When an address 17 of the sector having data to reproduce is detected, the CPU 7 commands the demodulating block 18 and the error detecting and correcting circuit 14 to reproduce the data. Explanation of controlling signals sent from the CPU will be omitted.

As mentioned before, each sector of the optical disk 1 has a synchronization signal and a resynchronization signal recorded therein together with the data itself. The synchronization and the resynchronization signals are detected respectively by the DM detector 10 and the RS detector 9. Referring to these signals, the timing gate generator 13 sends a demodulating gate signal 19 to the demodulator 12 and also sends a demodulating data gate signal 20 to the error detecting and correcting circuit 14.

The demodulator 12 demodulates the read-out data 21 into the demodulated data 22 and sends it to the error detecting and correcting circuit 14, the data 21 being recorded with the (2, 7) RLLC (run length limited code) or another modulation system.

When the envelope detector 8 detects that an envelope of the amplified read-out signal is below a specified level, it sends a drop-out pointer 23 as an error pointer to the error detecting and correcting circuit 14.

The error detecting and correcting circuit 14 also receives a modulation rule violation signal 24 as another error pointer from the modulation rule violation detector 16, which generates the signal 24 when detecting a (2, 7) RLLC modulation rule violation concerning the read-out data 21.

The error detecting and correcting circuit 14 operates error detection and correction including erasure correction by using the RAM 15 as an operating buffer and also by using each error pointer.

As mentioned above, in a conventional data reproducing apparatus, error detection and correction including erasure correction is carried out by detecting a modulation rule violation or a drop-out of an envelope and using it as an error pointer.

According to the above construction, however, error pointers and the demodulated data 22 are all sent through different data lines to the error detecting and correcting circuit 14. If many kinds of error pointers are to be sent, many data lines are necessary, which enlarges the mounting surface area of the printed circuit board. If the demodulating block 18 and the error detecting and correcting circuit 14 are disposed separately for a driver and a controller such as in an ESDI interface, many connecter pins are necessary, which heightens the manufacturing cost.

SUMMARY OF THE INVENTION

Accordingly, it is a first object of this invention to offer a data reproducing apparatus in which a demodulated data and an error pointer can be transmitted through one data line.

It is a second object of this invention to offer a useful technology for an external storage device of a computer.

The above objects are fulfilled by a data reproducing apparatus which reproduces data by conducting erasure correction of an error by use of an error pointer, the erasure correction being conducted while the data is decoded, the apparatus comprising a data recording medium for storing data with a specified modulation system, the data being coded with an error detection and correction code; a data reading device for reading the data stored in the data recording medium as a binary code; a data demodulating device for demodulating the data read by the data reading device with a demodulation system corresponding to the modulation system and thus generating demodulated data; error pointer generating device for generating an error pointer based on error information concerned with the data read by the data reading device; time division multiplexing device for time-division-multiplexing the demodulated data and the error pointer into a time division multiplex signal and transmitting the signal through a data line; and decoding device connected with the time division multiplexing device through the data line, the decoding device being for dividing the time division multiplex signal into the demodulated data and the error pointer, conducting erasure correction of the demodulated data by use of the error pointer, and decoding the demodulated data.

The data recording medium may be an optical disk, and the specific modulation system may be the run length limited code modulation system.

The data reading device may comprise an optical head for reading out the data from the optical disk and a comparator for converting the data read by the data reading device into a binary code.

The error pointer generating device may comprise an envelope detecting circuit for generating an error pointer when detecting that an envelope of the data which has been read out but not yet been converted into the binary code is below a specified level; and a modulation rule violation detecting circuit for generating another error pointer when detecting a modulation rule violation of the binary code.

The time division multiplexing device may comprises a dividing circuit for dividing the demodulated data into symbols, each of which is a unit of error detection and correction; and a converting circuit for adding an error pointer to each symbol and thus converting the symbol added with the error pointer into serial signals.

The time division multiplexing device may transmit the data to the decoding device faster than the data is demodulated by the data demodulating device.

The dividing circuit may comprise a shift register having steps corresponding to the number of bits of one symbol; and the converting circuit may comprise a parallel/serial converting circuit for loading parallel signals outputted from steps of the shift register and the error pointer in parallel and sending the signals and the pointer bit-serially in a specified order in synchronization with a transmitting clock.

The decoding device may include a serial/parallel converting circuit for converting the signals and the pointer which have been sent out from the parallel/serial converting circuit and decomposing the same into the demodulated data and the error pointer.

The time division multiplexing device may be a select circuit for selecting the demodulated data and the error pointer in a specified order determined by a select signal and sending out the same bit-serially in synchronization with the transmitting clock.

The select circuit may include a circuit for dividing the demodulated data into symbols, each of which is a unit of error detection and correction, and sending the symbols and the error pointer bit-serially in the specified order.

According to the above construction, the demodulated data and the error pointer can be transmitted through one data line. Consequently, many kinds of error pointers can be used without increasing a mounting surface area of a printed circuit board or the number of connector pins, thus realizing a highly reliable data reproducing apparatus.

The above objects are also fulfilled by an external storage device of a computer, the apparatus comprising an optical disk for storing a data, the data being modulated with the run length limited code modulation system and also being coded with an error detection and correction code; data reading device for reading the data stored in the optical disk and converting the data into a binary code by use of a binary circuit; data demodulating device for demodulating the binary code with a demodulation system corresponding to the run length limited code modulation system; first error pointer generating device for supervising an envelope of the data which has been read but not yet converted into a binary code and generating an error pointer when the envelope is below a specified level; second error pointer generating device for supervising the binary code and generating an error pointer when the binary code violates a modulation rule of the run length limited code modulation system; select device for selecting the demodulated data and the error pointers generated by the first and the second error pointer generating device in a specified order determined by a select signal and sending out the same bit-serially as serial signals in synchronization with a transmitting clock; serial/parallel converting device for decomposing the serial signals into the demodulated data and the error pointers; and error detecting and correcting device for conducting erasure correction of the demodulated data by use of error pointers obtained by the serial/parallel converting device and then decoding the demodulated data.

The select device may comprise a dividing circuit for dividing the demodulated data into symbols, each of which is a unit of error detection and correction; and a converting circuit for adding an error pointer to each symbol and thus converting the symbol added with the error pointer into serial signals.

The transmitting clock may be set for a higher frequency than a clock used in the data demodulating device.

According to the above construction, an extremely reliable external storage device of a computer is realized.

BRIEF DESCRIPTION OF THE DRAWINGS

These and other objects, advantages and features of the invention will become apparent form the following description thereof taken in conjunction with the accompanying drawings which illustrate a specific embodiment of the invention. In the drawings:

FIG. 5 is a block diagram of a decoding block of the above embodiment.

DESCRIPTION OF AN PREFERRED EMBODIMENT

A data reproducing apparatus according to this invention will be described with reference to figures.

Figure 1:
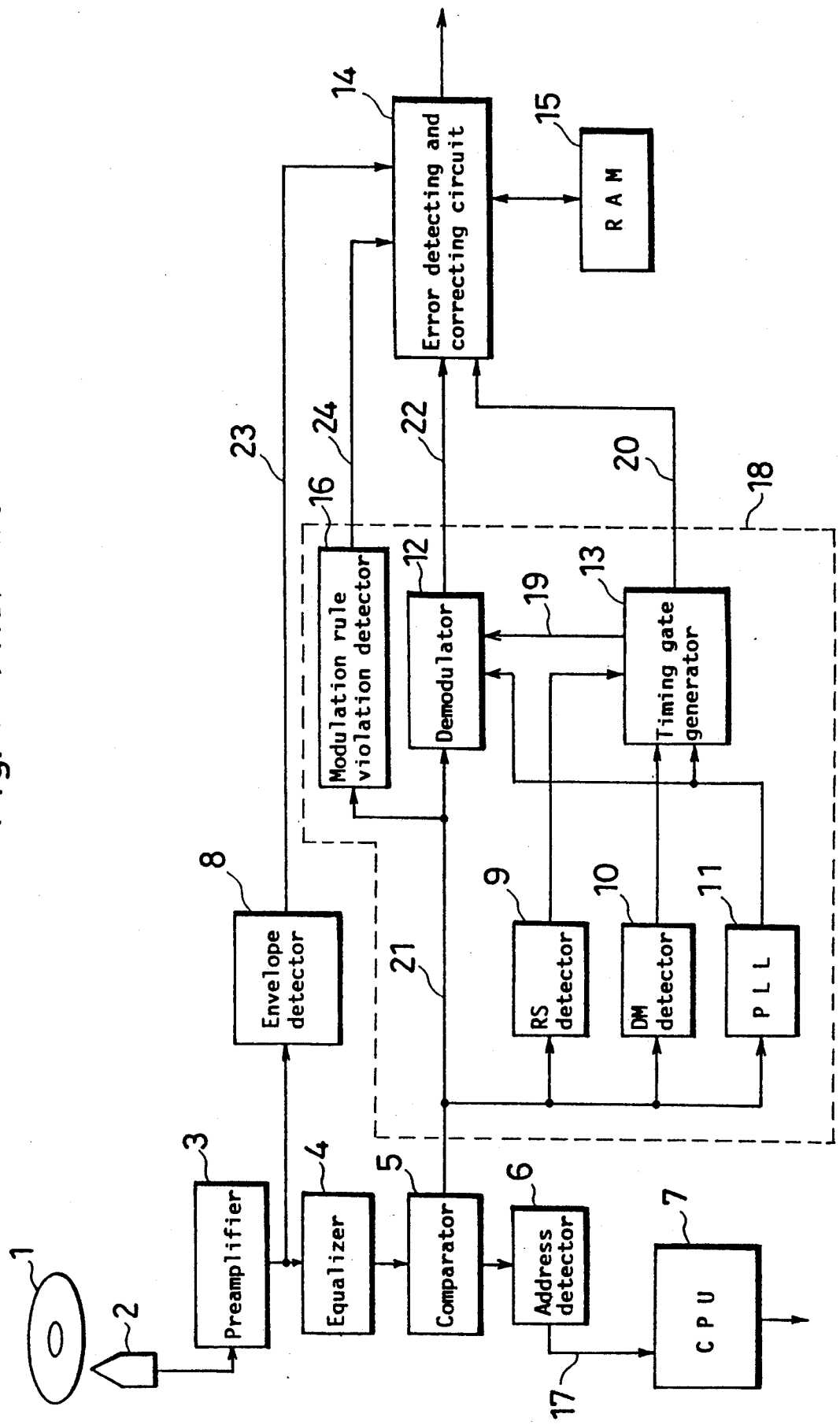
FIG. 1 is a block diagram of a conventional data reproducing apparatus.
Figure 2:
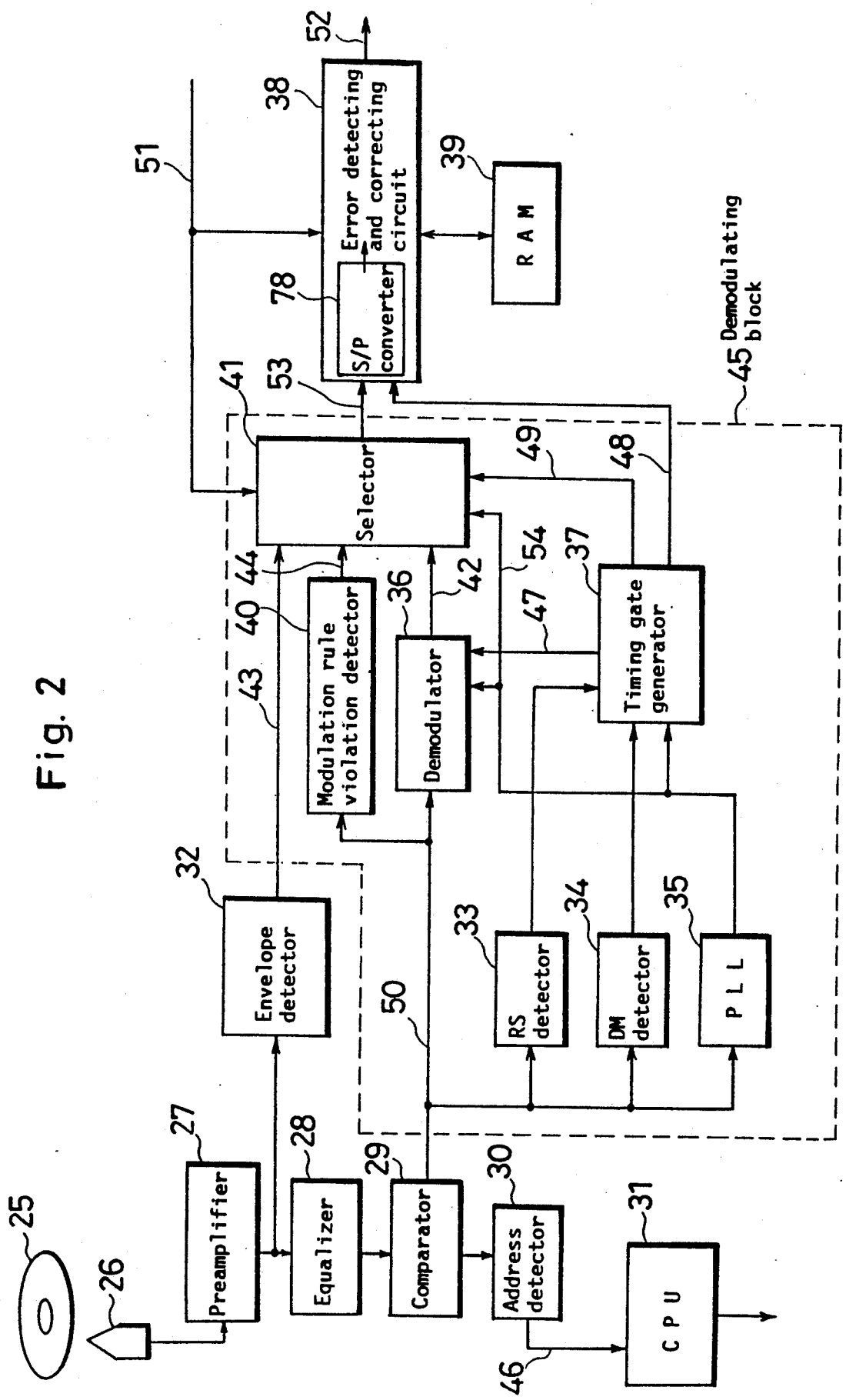
FIG. 2 is a block diagram of a data reproducing apparatus as an embodiment according to this invention.

In FIG. 2, 25 refers to an optical disk comprising sectors, each of which stores a data therein, 26 to an optical head formed of a semiconductor laser or the like, 27 to a preamplifier for amplifying a signal read out from the optical disk (will be referred to as a read-out signal, hereinafter), 28 to an equalizer for equalizing a waveform, 29 to a comparator for converting the read-out signal into a binary read-out data 50 in accordance with a reference value, 30 to an address detector for detecting an address recorded in a head of each sector, and 31 to a CPU for totally controlling the apparatus. 32 refers to an envelope detector for detecting that an envelope of the amplified read-out signal is below a specified level and then generating an error pointer, 33 to an RS detector for detecting resynchronization signals which are recorded in the optical disk 25 at a certain pitch, the resynchronization signals being for compensating for bit slips, 34 to a DM detector for detecting a synchronization signal indicating a leading edge of the data, and 35 to a PLL circuit for reading out a demodulation clock 54 from the read-out data 50, the demodulation clock being used for demodulation of the read-out data 50. 36 refers to a demodulator for demodulating the read-out data 50 into a demodulated data 42, 37 to a timing gate generator for controlling demodulating timing, and 38 to an error detecting and correcting circuit for decoding an error detection and correction code. 78 is an S/P converter for converting a serial signal into a parallel signal, the S/P converter belonging to the error detecting and correcting circuit 38. 39 is a RAM used to operate the error detecting and correcting circuit 38 and also used as a data buffer. 40 refers to a modulation rule violation detector for detecting a modulation rule violation and then generating an error pointer. 41 is a selector, which is an example of a time division multiplexer for time-division-multiplexing and selectively sending the demodulated data 42, the error pointer generated by the envelope detector 32 and the other error pointer generated by the modulation rule violation detector 40 to the error detecting and correcting circuit 38. A block defined by a dashed line is usually realized as a single circuit block referred to as a demodulating block 45.

The apparatus having the above construction is operated in the following way.

From a signal read out from the optical disk 25, addresses are detected by the address detector 30. When an address 46 of the sector having the data to reproduce is detected, the CPU 31 commands the demodulating block 45 and the error detecting and correcting circuit 38 to reproduce the data.

As mentioned before, each sector of the optical disk 25 has a synchronization signal and a resynchronization signal recorded therein together with the data itself. The synchronization and the resynchronization signals are detected respectively by the DM detector 34 and the RS detector 33. Referring to these signals, the timing gate generator 37 sends a demodulating gate signal 47 to the demodulator 36 and also sends a demodulating data gate signal 48 to the error detecting and correcting circuit 38, thereby controlling operation timing of the demodulator 36 and the circuit 38.

In accordance with the demodulating gate signal 47, the demodulator 36 demodulates the read-out data 50 into the demodulated data 42 and sends it to the selector 41, the data 50 being recorded with the (2, 7) RLLC or another modulation system.

When the envelope detector 32 detects that an envelope of the amplified read-out signal is below a specified level, it sends a drop-out pointer 43 as an error pointer to the selector 41.

The selector 41 also receives a modulation rule violation signal 44 as another error pointer from the modulation rule violation detector 40, which generates the error pointer when detecting a (2, 7) RLLC modulation rule violation concerning the read-out data 50.

In accordance with a select signal 49 sent from the timing gate generator 37, the selector 41 selectively sends the demodulated data 42, the drop-out pointer 43 and the modulation rule violation signal 44 to the error detecting and correcting circuit 38 bit-serially through a data line 53 in synchronization with a transmission clock 51. The circuit 38 operates error detection and correction including erasure correction by use of the pointer 43 and the signal 44 so as to generate a data 52, thereafter the circuit 38 sends the data 52 to a host computer through a host interface such as an SCSI.

Generally in a data reproducing apparatus for reproducing data from an optical disk or the like, a multiplex error correction code such as a Reed-Solomon code is used. In other words, error detection and correction is not done bit by bit, but coding and decoding is done on a symbol-by-symbol basis, each symbol consisting of several bits. In the case of Reed-Solomon code of $GF(2^4)$, for instance, a symbol consists of 4 bits.

Figure 3:
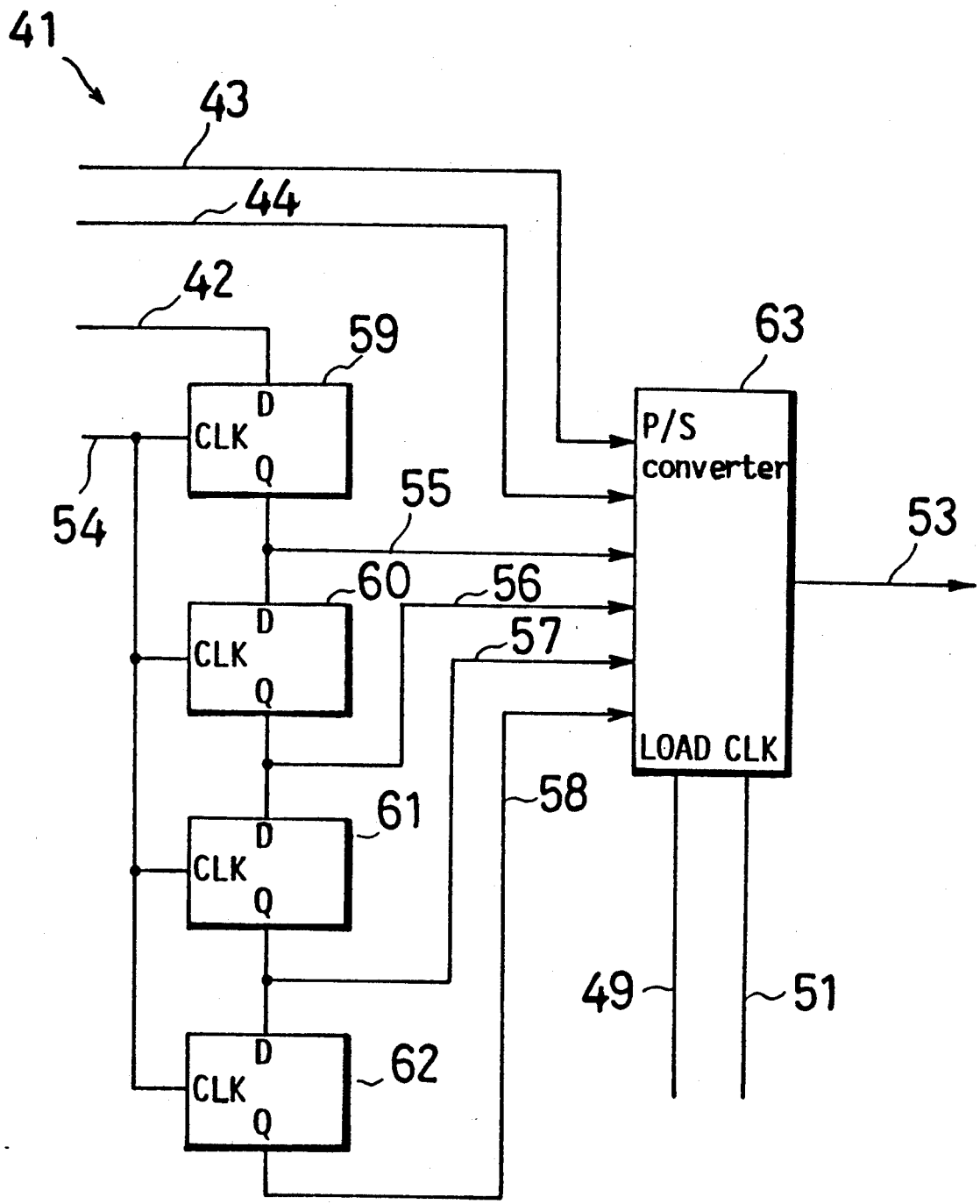
FIG. 3 is a block diagram of a main portion of the same.

FIG. 3 is a detailed block diagram of the selector 41. 59, 60, 61 and 62 refer to D flip-flops constituting a shift register. 63 is a P/S converter for converting a parallel signal into a serial signal. In FIG. 3, a symbol, which is a unit of error detection and correction, consists of 4 bits. The demodulated data 42, the drop-out pointer 43 and the modulation rule violation signal 44 are transmitted through the data line 53 bit serially.

Figure 4:
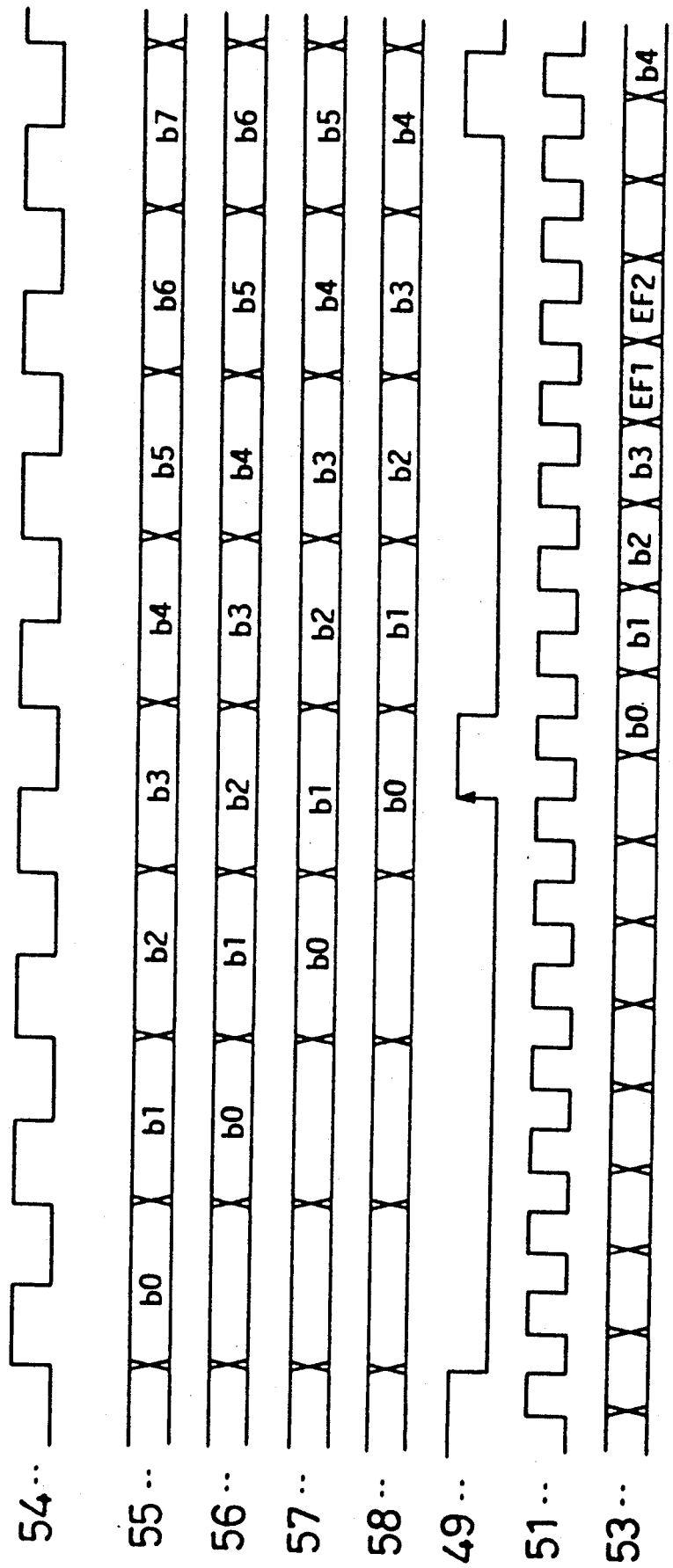
FIG. 4 is a timing chart of operation of the circuits illustrated in FIG. 3.

FIG. 4 is a timing chart of the selector 41. The demodulation clock 54 operates in synchronization with the demodulated data 42. 55 through 58 refer to outputs from the flip-flops 59 through 62, respectively. The select signal 49 operates in synchronization with each symbol of the demodulated data 42. b0 through b3 indicate the four bits that constitute a symbol of the demodulated data 42, respectively; and EF1 and EF2 indicate bits of the modulation rule violation signal 44 and the drop-out pointer 43, respectively.

When all of the four bits (b0, b1, b2 and b3) of the demodulated data 42 are outputted as 55 through 58 from the flip-flops 59 through 62, b0 through b3, EF1 and EF2 are loaded on the P/S converter 63 in parallel in synchronization with the select signal 49. Then, the total 6 bits are converted into serial signals by the P/S converter 63 and are sent out to the error detecting and correcting circuit 38 serially in the order of b0, b1, b2, b3, EF1 and EF2 through the data line 53 in synchronization with the transmission clock 51. The transmission clock 51 has a higher frequency than the demodulation clock 54, whereby the former sends out all the 6 bits while the latter receives the 4 bits.

FIG. 5 is a detailed block diagram of the S/P converter 78 for converting the 6 bits sent through the data line 53 serially into parallel signals. 64 through 75 refer to D flip-flops.

In the S/P converter 78, the 4 bits of the demodulated data 42, the drop-out pointer 43 and the modulation rule violation signal 44 are shifted into the flip-flops 64 through 69 in this order in synchronization with the transmission clock 51 and then loaded on the flip-flops 70 through 75 in synchronization with the demodulating data gate signal 48. In this way, the 6 bits are converted into parallel signals, namely, two error pointers 76 and a demodulated data symbol 77 consisting of 4 bits.

The error detecting and correcting circuit 38 stores the error pointers 76 and the demodulated data symbol 77 in the RAM 39 and carries out error detection and correction including erasure correction.

The above embodiment employs the (2, 7) RLLC modulation system. In this case, the modulation rule violation detector 40 detects a modulation rule violation when the number of zero between binary 1 and 1 is other than 2 through 7.

According to this invention, as has been described so far, the demodulated data 42 and the error pointers 43 and 44 are sent out selectively and bit-serially by the selector 41. As a result, the error pointers can be transmitted from the demodulation block 45 to the decoding block without increasing the number of the data line.

Although one symbol of the demodulated data 42 consists of 4 bits in the above embodiment, one symbol may consist of any number of bits corresponding to the error detection and correction code.

Although the selector 41 is used as a time division multiplexer in the above embodiment, another construction is also employable only if a demodulated data and error pointers are time-division-multiplexed and thus are transmitted through one data line.

Although used as error pointers are the drop-out pointer and the modulation rule violation signal in the above embodiment, other error pointers can be used. For example, an error pointer which indicates a resynchronization signal has not been detected can be used.

Although the present invention has been fully described by way of an embodiment with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A data reproducing apparatus which reproduces data by conducting erasure correction of an error in the data by use of an error pointer, the erasure correction being conducted while the data is decoded, said apparatus comprising:

a data recording medium for storing data with a specified predetermined modulation system, the data being coded with a dropout pointer signal and a modulated rule violation signal;

data reading means for reading the data stored in said data recording medium as a binary code;

data demodulating means for demodulating the data read by said data reading means with a demodulation system corresponding to the predetermined modulation system and thus generating demodulated data;

dropout pointer signal generating means for supervising an envelope of the data which has been read but not yet converted into a binary code and generating a dropout pointer signal when the envelope is below a predetermined level;

modulated rule violation signal generating means for supervising the binary code and generating a modulation rule violation signal when the binary code violates a modulation rule of the predetermined modulation system;

select signal generating means for generating a select signal in synchronization with one symbol of the demodulated data;

dividing means for dividing the demodulated data on a symbol-by-symbol basis by use of said select signal;

time division multiplexing means for time-division-multiplexing the demodulation data of one symbol and both the dropout pointer signal and modulated rule violation signal concerning the demodulated data in a specified order determined by said select signal into a time division multiplex signal and transmitting bit-serially the signal through a data line, said time-division-multiplexing being executed with a transmitting clock faster than a demodulated clock with which said timing of data demodulating is controlled; and decoding means connected downstream of said time division multiplexing means through the data line for decoding both the dropout pointer signal and modulated rule violation signal, said decoding means for dividing the time division multiplex signal into the demodulated data, the dropout pointer signal, and the modulated rule violation signal, and conducting error detection and correction including erasure correction of the demodulated data by use of the dropout pointer signal and the modulated rule violation signal, and decoding the demodulated data.

2. The data reproducing apparatus of claim 1, wherein said data recording medium is an optical disk, and the specific modulation system is the run length limited code modulation system.

3. The data reproducing apparatus of claim 2, wherein said data reading means comprises an optical head for reading out the data from the optical disk and a comparator for converting the data read by said data reading means into a binary code.

4. The data reproducing apparatus of claim 1, wherein said error pointer generating means comprises: an envelope detecting circuit for generating an error pointer when detecting that an envelope of the data which has been read out but not yet been converted into the binary code is below a specified level; and a modulation rule violation detecting circuit for generating another error pointer when detecting a modulation rule violation of the binary code.

5. The data reproducing apparatus of claim 4, wherein a frequency of the transmitting clock is set so that the number of pulses in one cycle of the select signal is not less than the sum of the number of bits that constitutes one symbol of the demodulated data and the number of the error pointers.

6. The data reproducing apparatus of claim 5, wherein said dividing means comprises a shift register having steps corresponding to the number of bits of one symbol; and the time division multiplexing means comprises a parallel/serial converting circuit for loading parallel signals outputted from steps of the shift register and the error pointer in parallel and sending the signals and the pointer bit-serially in a specified order in synchronization with a transmitting clock.

7. The data reproducing apparatus of claim 6, wherein said decoding means includes a serial/parallel converting circuit.

* * * * *